United States Patent [19]

Lindblom et al.

[11] 3,821,564

[45] June 28, 1974

[54] CONTROL CIRCUIT FOR A THYRISTOR

[75] Inventors: Georg Lindblom; Karl-Erik Olsson, both of Ludvika, Sweden

[73] Assignee: Allmanna Svenska Elektriska Aktienbolaget, Vasteras, Sweden

[22] Filed: Jan. 29, 1973

[21] Appl. No.: 327,437

[30] Foreign Application Priority Data

Feb. 1, 1972 Sweden .............................. 1103/72

[52] U.S. Cl. ....... 307/252 H, 307/252 L, 307/252 Q

[51] Int. Cl. ........................ H03k 17/16, H03k 17/56

[58] Field of Search ..... 307/246, 262, 252 H, 252 J, 307/252 K, 252 N, 252 Q, 252 T, 252 W, 284, 293, 305

[56] References Cited

UNITED STATES PATENTS

| | | | |
|---|---|---|---|
| 3,525,021 | 8/1970 | Engman | 307/293 X |
| 3,629,683 | 12/1971 | Nickolls | 321/44 X |
| 3,700,933 | 10/1972 | Harkenrider et al. | 307/252 T X |
| 3,711,761 | 1/1973 | Watson | 307/252 N X |
| 3,719,859 | 3/1973 | Frantz et al. | 307/235 R X |
| 3,729,670 | 4/1973 | Dewey | 307/252 Q X |

FOREIGN PATENTS OR APPLICATIONS

| | | | |
|---|---|---|---|
| 43-23,810 | 2/1968 | Japan | 307/252 T |

*Primary Examiner*—Rudolph V. Rolinec
*Assistant Examiner*—L. N. Anagnos

[57] ABSTRACT

A control circuit for a thyristor includes a voltage divider connected in parallel with the thyristor for feeding the control circuit. The voltage divider includes a resistor nearest the anode of the thyristor and in series with the resistor a parallel connection of a capacitor, a Zener-diode and a varistor. The feeding circuit of the control circuit is connected over such parallel connection. The resistor is dimensioned with regard to the desired current in the voltage divider, while the parallel connection is dimensioned to store in the condensor the necessary feeding voltage over the control circuit.

6 Claims, 3 Drawing Figures

CONTROL CIRCUIT FOR A THYRISTOR

The present invention relates to a control circuit for a thyristor comprising a voltage divider connected in parallel with the thyristor for feeding of the control circuit and an input circuit for the control circuit.

SUMMARY OF THE INVENTION

The object of this invention is first of all to obtain a voltage divider for such a control circuit, giving a stable voltage for feeding of the control circuit, despite variations in the feeding voltage. Such a voltage divider is achieved according to the invention by connecting a large resistor, determining the current in the voltage divider, in series with a parallel connection of a capacitor and a Zener-diode and a varistor, and the control circuit with the voltage divider is then given a design as described hereinafter.

Despite said design of the voltage divider, overvoltages over the thyristor may anyhow be transmitted to the input stage of the control circuit. Because of the Miller-capacitance of the transistors at the input stage, such overvoltages can cause disturbance signals at the input stage. To avoid this it is suggested, according to a further development of the invention, to connect a voltage derivative member for removing such disturbance signals. The voltage derivative member consists of a capacitor and this can be arranged to remove the actual disturbance signal, or the current in the capacitor may be arranged to control an extra transistor for removing the disturbance signal.

BRIEF DESCRIPTION OF THE DRAWINGS

In other respects the invention will be further described with reference to the accompanying drawing, in which FIG. 1 shows a thyristor with a control circuit according to the invention, whereas

DESCRIPTION OF THE PREFERRED EMBODIMENTS

Figure 1:
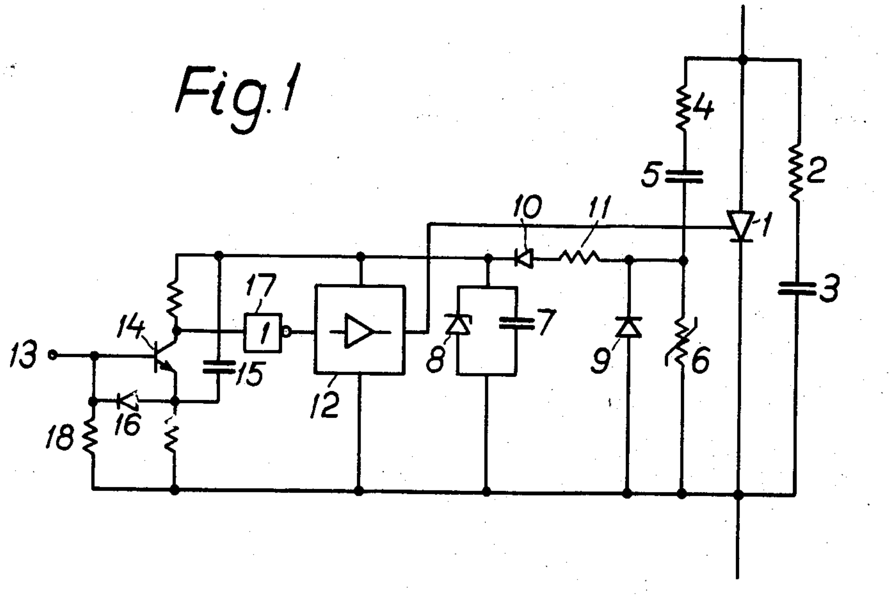

FIG. 1 shows a thyristor 1, connected in parallel with a main voltage divider 2, 3 and an auxiliary voltage divider consisting of components 4 – 11. The main voltage divider 2, 3 is intended, in the case of a series connection of a large number of thyristors in a thyristor rectifier for high voltage, to secure an even voltage distribution along such a series of thyristors. The auxiliary voltage divider, on the other hand, is intended for the control circuit according to the invention and consists in the first place of a resistor 4, dimensioned with regard to the desired current in the voltage divider at maximum voltage over the thyristor. In order to avoid a direct connection past the thyristor, the resistor 4 has been connected in series with a capacitor 5.

A parallel connection of the capacitor 7, the Zener-diode 8 and the varistor 6 has been arranged in series with the resistor 4 and the capacitor 5. The capacitor 7 is here included as an energy storing means for the control circuit, whereas the varistor 6 and the Zener-diode 8 are dimensioned to give the voltage required for the control circuit. In principle, it would be sufficient with only the varistor 6 or the Zener-diode 8, but none of these components are ideal at transient overvoltages, so that steep voltage derivatives might be transmitted as overvoltages in the control circuit. On the other hand, it has been found that the varistor and the Zener-diode are complementary to each other so that they together prevent such overvoltages from influencing the control circuit and provide a rapid limitation of the feeding voltage to the control circuit.

The resistor 11 determines the charging current for the capacitor 7 and the diode 10 prevents the capacitor from discharging when the high-voltage pulse over the thyristor 1 ceases. The diode 9, in turn, is intended for discharging and recharging of the capacitor 5 at negative voltage over the thyristor.

The control circuit is provided with an input circuit and an amplifier stage 12 of known kind, fed over the capacitor 7 and connected to the control electrode of the thyristor.

The input circuit has an input electrode 13 intended to be connected to a control device, not shown. The input electrode 13 is connected to the base of a transistor 14, the collector of which is connected to the input of the amplifier stage 12 over an inversion device 17. If the electrode 13 is influenced by a signal, the transistor 14 becomes conductive, and its collector voltage falls. Thus, the input voltage of the inversion device 17 falls, said device then emitting a signal for ignition of the thyristor 1.

Because of the limitation in the feeding circuit, rapid, positive voltage derivatives are obtained on the feeding voltage to the transistor 14. This may, for example because of the Miller-capacitance, cause the transistor to become at least partly conductive, and this gives a disturbance signal to the stages 17 and 12. In order to avoid this, the capacitor 15 has been connected in parallel with the transistor 14, at the same time as the diode 16 has been inserted. An overvoltage from the voltage divider 4, 5, 6 will thus involve a charging current over the capacitor 15, the diode 16 and the resistor 18, and in this way the base of the transistor 14 will have a lower polarity than the emitter, on account of the voltage fall over the diode 16, so that the transistor remains effectively blocked.

Figure 2:
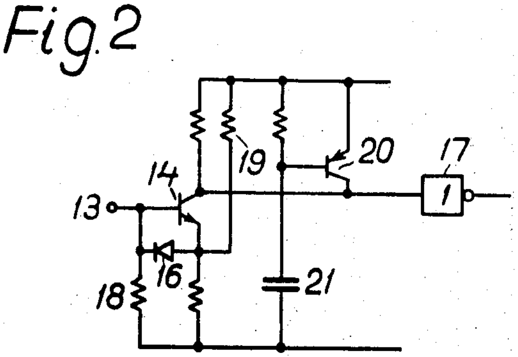
FIGS. 2 and 3 show variants of the input stage in such a control circuit.

FIG. 2 shows a variant of the input stage in FIG. 1. Instead of the capacitor 15, in parallel with the transistor 14, a transistor 20 and a capacitor 21 have been inserted. Voltage derivatives which tend to make transistor 14 conductive will also give a charging current in the capacitor 21, and thus the transistor 20 receives control current and becomes conductive. In this way the collector potential of the transistor 14 is maintained and no change of signal occurs on the input to the inversion device 17. To secure the blocking of the transistor 14 when no input signal occurs on the electrode 13, the resistor 19 has been connected parallel to the transistor 14. Such a resistor may also be suitably connected in FIG. 1 parallel to the capacitor 15.

Figure 3:
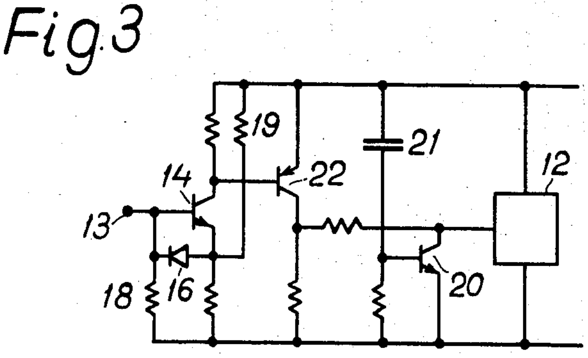

The inversion stage 17 in FIGS. 1 and 2 may, for example, consist of a transistor 22, as is clear from FIG. 3. Further the capacitor 21 and the transistor 20 may be positioned between the transistor 22 - or the inversion device 17 - and the amplifier stage 12, as has also been shown in FIG. 3. In this way, any disturbance signals, owing to voltage derivatives which would make transistor 14 conductive, will be short-circuited by the transistor 20 because of the charging current through the capacitor 21.

Thus, the advantages of the invention are in the first place a strong limitation of any overvoltages in the feeding voltage for the control circuit, and in the second place an elimination of the influence, if any, of voltage pulses on the undisturbed operation of the control circuit.

We claim:

1. A thyristor circuit comprising two end terminals for connecting the circuit to an outer voltage source, a main thyristor (1) connected to said end terminals with its anode and cathode, respectively, a control circuit (12–18) for said main thyristor, and a voltage divider (4–11) connected in parallel with said thyristor between said end terminals for feeding the control circuit with a voltage from said outer voltage source, said control circuit having an input circuit (13–18) for connection to an outer control device, and an output circuit (12) connected to a control electrode of said thyristor, said control circuit including means to transmit and amplify through its input and its output circuit a control pulse from said outer control device to said control electrode, said voltage divider including means to prevent overvoltages from said outer voltage source from being transmitted to said control circuit, said means comprising a first resistor (4) nearest to the anode of the thyristor and, in series with said resistor, a parallel connection of a capacitor (7), a Zener-diode (8) and a varistor (6), the control circuit (12–18) being connected to and fed from said parallel connection, said first resistor (4) being dimensioned with regard to the desired current in the voltage divider, said parallel connection being dimensioned to store in the condenser a predetermined voltage over the control circuit independent of variations in said outer voltage.

2. A thyristor circuit according to claim 1, in which said capacitor (7) and Zener-diode (8) are connected in series with a diode (10), the conducting direction of which corresponds to the conducting direction of the thyristor (1).

3. A thyristor circuit according to claim 2, in which said diode (10) is connected in series with a second resistor (11) and said first resistor (4) is connected in series with a capacitor (5).

4. A thyristor circuit according to claim 1, in which said input circuit comprises at least one transistor (14), and in which, in order to avoid disturbance signals at the input circuit due to overvoltages in said voltage divider, a voltage derivative member (15) is connected to the input circuit to remove such disturbance signals.

5. A thyristor circuit according to claim 4, in which said voltage derivative member comprises a capacitor (15) connected in parallel with a transistor (14) at the input circuit.

6. In a thyristor circuit according to claim 4, said voltage derivative member comprising another transistor (20), controlled by the current in a second capacitor (21) connected to remove said disturbance signals.

* * * * *